United States Patent [19]

Baba et al.

[11] Patent Number: 5,747,694

[45] Date of Patent: May 5, 1998

[54] PRESSURE SENSOR WITH BARRIER IN A PRESSURE CHAMBER

[75] Inventors: Horonobu Baba, Obu; Tiaki Mizuno, Toyota; Masahito Imai, Chita; Yuichi Yokoyama; Masaki Takakuwa, both of Toyohashi; Yasuki Shimoyama, Nukata-gun, all of Japan

[73] Assignee: Nippondenso Co., Ltd., Japan

[21] Appl. No.: 686,601

[22] Filed: Jul. 26, 1996

[30] Foreign Application Priority Data

| Jul. 28, 1995 | [JP] | Japan | 7-193883 |
| Jul. 28, 1995 | [JP] | Japan | 7-193884 |
| Jul. 31, 1995 | [JP] | Japan | 7-195598 |

[51] Int. Cl.$^6$ .................................................. G01L 9/00
[52] U.S. Cl. .................................................. 73/723
[58] Field of Search .......................... 73/706, 720, 721, 73/722, 723, 724, 725, 726, 727, 756

[56] References Cited

U.S. PATENT DOCUMENTS

| 3,678,753 | 7/1972 | Eggleston et al. | 73/726 |
| 4,866,989 | 9/1989 | Lawless | 73/726 |
| 5,014,557 | 5/1991 | Lawless | 73/756 |
| 5,029,479 | 7/1991 | Bryan | 73/721 |
| 5,595,939 | 1/1997 | Otake | 437/209 |

FOREIGN PATENT DOCUMENTS

| 1-189539 | 7/1989 | Japan. |
| 1-236028 | 9/1989 | Japan. |
| 1-288746 | 11/1989 | Japan. |
| 3-226638 | 10/1991 | Japan. |
| 5-283713 | 10/1993 | Japan. |
| 6-3211 | 1/1994 | Japan. |
| 7-209115 | 8/1995 | Japan. |

OTHER PUBLICATIONS

Journal of Nippondenso Technical Disclosure No. 14–065 A Pedestal is fixed to a housing via a stem (Apr. 20, 1979).
Journal of Nippondenso Technical Disclosure No. 75–085. A pedestal is fixed to a housing via stem Nov. 15, 1995.
Journal of Nippondenso Technical Disclosure No. 57–129. A filter 2 is provided Mar. 15, 1985.
Journal of Nippondenso Technical Disclosure No. 61–053. A tip of a pressure introduction pipe is formed as illustrated in Figure 2. Sep. 15, 1988.
Journal of Nippondenso Technical Disclosure No. 40–108. A tip of a projection port is formed in tapered shape Mar. 15, 1985.

*Primary Examiner*—William L. Oen
*Attorney, Agent, or Firm*—Cushman Darby & Cushman Intellectual Property Group of Pillsbury Madison & Sutro, LLP

[57] ABSTRACT

A pressure sensor has a resin housing containing a pressure sensor positioned between a reference pressure chamber and a pressure to be measured. A terminal extends through the housing toward the sensor. A wire connects the terminal to the sensor. When a connector is connected to the terminal, it may compress air around the terminal. The compressed air may travel along the terminal and break the wire connected to the sensor. To prevent such breakage, a barrier wall is provided to block the compressed air from penetrating toward the wire. The reference pressure chamber is divided into a main chamber and a subchamber by the barrier wall. Since the barrier wall blocks the compressed air, the compressed air can not reach a silicon gel on the sensor and the wire in the main chamber. Therefore, the wire is protected.

12 Claims, 9 Drawing Sheets

5,747,694

PRESSURE SENSOR WITH BARRIER IN A PRESSURE CHAMBER

BACKGROUND OF THE INVENTION

1. Field of the Invention

The present invention relates to a pressure sensor for detecting pressure. Particularly, the present invention is applicable to, for example, a relative pressure sensor for detecting a pressure difference between atmospheric pressure in a reference pressure chamber and pressure to be measured in a measurement pressure chamber.

2. Description of Related Art

In the conventional absolute pressure sensor disclosed in JP-A-6-3211, a semiconductor sensing chip is housed in a resin case. The resin case has a pressure inlet port and a connecting portion, and is formed by insert molding to have a terminal. Pressure at a pressure inlet port is detected and converted into electric information, and then transmitted to an external circuit through a bonding wire and the terminal which is formed by the insert molding.

The above construction makes it possible to simplify the pressure sensor.

SUMMARY OF THE INVENTION

When the above mentioned absolute pressure sensor is modified to be a relative pressure sensor, it is necessary to provide an atmospheric pressure inlet port which communicates with an internal chamber where a chip is disposed and to cover the chip and a wire with a silicone gel for moisture proofing or the like. In this case, when a connector is connected to a terminal of the case, air may be led into the resin case along with the terminal because air between the resin case and a seal rubber of the connector is compressed. Such compressed air may be led into the silicone gel as a bubble and may cause the wire connected to the sensor to break by pushing the wire.

The present invention has an object to provide a pressure sensor in which a wire connected to the sensor does not break as a result of air which is compressed when a connector is connected to the sensor.

Another object of the present invention is to provide a pressure sensor in which a reference pressure inlet port is not blocked by contaminants.

Another object of the present invention is to provide a sensor which can reduce a characteristic fluctuation of a pressure sensitive element.

Another object of the present invention is to provide a method for adhering a sensing chip to a housing which can reduce a characteristic fluctuation of a pressure sensitive element.

According to a first aspect of the present invention, the pressure sensor includes a reference pressure chamber having an inlet for introducing an atmospheric pressure thereinto, a barrier wall disposed in the reference pressure chamber to define a main chamber and a subchamber on opposite sides of the barrier wall, and a measurement pressure chamber opposite to the main chamber for introducing a pressure to be measured.

By the above arrangement, even if a compressed air is led into the reference pressure chamber along a boundary between a resin housing and a terminal, such compressed air is blocked by the barrier wall and led into the subchamber.

Since the barrier wall blocks the compressed air, the compressed air can not reach a silicon gel in the main chamber. Therefore, the wire will not be broken by the compressed air when the connector is connected.

According to another aspect of the present invention, an atmospheric pressure inlet port protrudes downwardly from a peripheral surface of the housing.

Since the inlet protrudes downwardly, it becomes more difficult for a contaminant to enter the atmospheric pressure inlet port.

Therefore, blocking caused by the contaminant can be prevented.

According to another aspect of the present invention, a sensitive element which is fixed to a glass pedestal is adhered to the housing using a fluorocarbon adhesive.

Since a fluorocarbon adhesive is used, the sensing chip is adhered tightly without high temperature. Therefore, a deterioration of the adhesive and a distortion of the housing due to temperature change can be prevented.

Therefore, a characteristic fluctuation of the pressure sensitive element can be reduced.

BRIEF DESCRIPTION OF THE DRAWINGS

Other features and advantages of the present invention will be appreciated, as well as methods of operation and the function of the related parts, from a study of the following detailed description, the appended claims, and the drawings, all of which form a part of this application. In the drawings:

DETAILED DESCRIPTION OF PRESENTLY PREFERRED EMBODIMENTS

Preferred embodiments of the present invention are hereinafter described with reference to the accompanying drawings.

(FIRST EMBODIMENT)

The first embodiment of the present invention is hereinafter described with reference to FIGS. 1 through 14.

Figure 1:
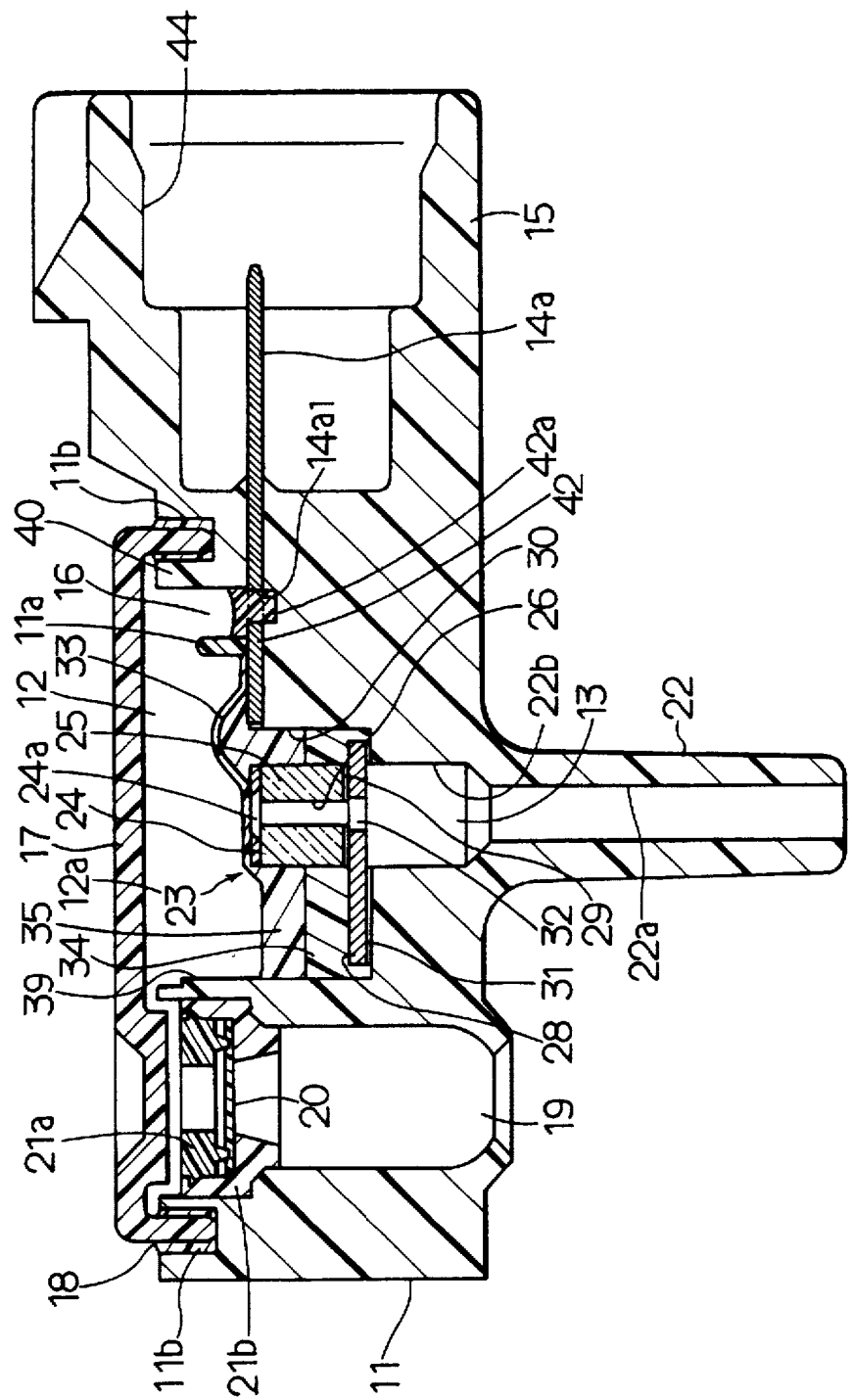
FIG. 1 is a sectional view of a pressure sensor according to a first embodiment of the present invention.

As shown in FIG. 1, a resin housing 11 which is made by PBT (poly butylene terephthalate) has a box-shaped recess 39. The recess 39 has a recess 30 at its bottom and a sensing chip 23 is mounted on the recess 30. A cylindrical measurement pressure inlet port 22 is perpendicularly and protrusively provided on the housing 11. A measurement pressure inlet passage 22a of the measurement pressure inlet port 22 is coaxially aligned with a measurement pressure inlet passage 22b which is provided at a bottom wall of the recess 39. The measurement pressure inlet passages 22a and 22b together form a measurement pressure chamber 13.

Figure 2:
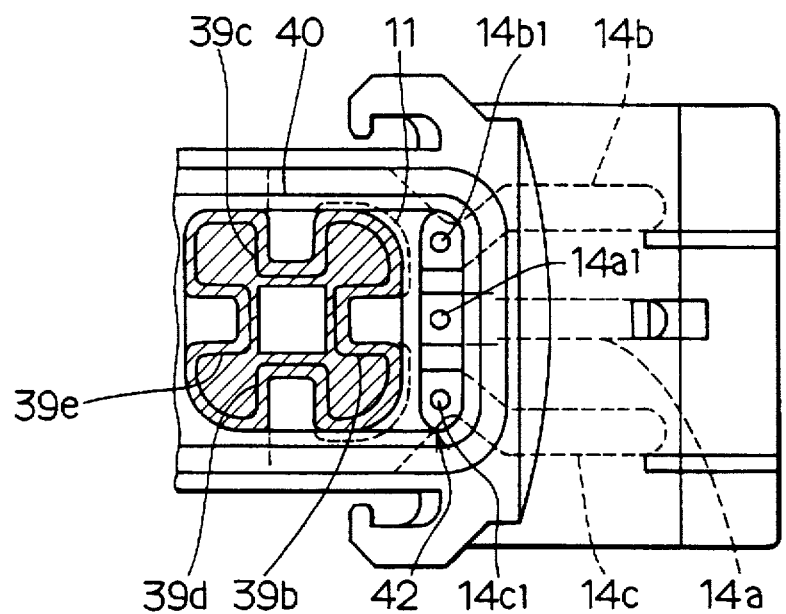
FIG. 2 is a partially schematic plan view of the pressure sensor according to the first embodiment of the present invention.

As shown in FIG. 2, connecting terminal bases 39b through 39e are provided at the center portions of each surrounding wall 40 of the recess 39, respectively, so as to protrude from each surrounding wall 40 to the sensing chip 23. The shape of each connecting terminal base is approximately square pole, having approximately the same height as the sensing chip 23. The connecting terminal base 39b is continuous with a base 42 which has the same height.

The surrounding wall 40 partly forms the recess 39 by surrounding the recess 30. A slot 11b which has a shape of a recess is provided around the surrounding wall 40 for fitting a lid 17 which is made by resin. By sealing the lid 17 with the slot 11b by an adhesive 18, a reference pressure chamber 12 is formed. An atmospheric pressure is led into the reference pressure chamber 12 through an atmospheric pressure inlet passage 19.

A barrier wall 11a which is made by resin is provided on terminals 14a through 14c and the base 42 for dividing the reference pressure chamber 12 into a main chamber 12a and a subchamber 16. The height of the barrier wall 11a is lower than the surrounding wall 40. Both ends of the barrier wall 11a are connected with the surrounding wall 40.

A connector shell 15 which has a connecting recess 44 at its inside surface is provided at an end of the housing 11. The terminal 14a through 14c are integrally provided by insert molding in the housing 11. One end of the terminal 14a (the left end in FIGS. 1 and 2) is placed on the connecting terminal base 39b and the other end (the right end in FIGS. 1 and 2) is located in the connecting recess 44. The terminals 14b and 14c are placed on the connecting terminal bases 39c and 39d respectively in the same manner as the terminal 14a.

Figure 3:
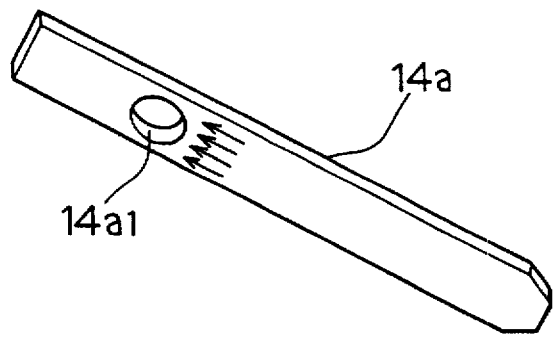
FIG. 3 is a perspective view of a terminal of the pressure sensor according to the first embodiment of the present invention.

As shown in FIG. 3, the terminal 14a has an air guidance hole 14a1. The terminals 14b and 14c also have air guidance holes 14b1 and 14c1 respectively. The location of the air guidance holes 14a1 through 14c1 is corresponding to the subchamber 16. Under the air guidance holes 14a1 through 14c1, cylindrical air capture recesses 42a, 42b (not shown) and 42c (not shown) whose diameter is the same as the air guidance hole 14a1 are provided on the surface of the base 42.

Figure 4:
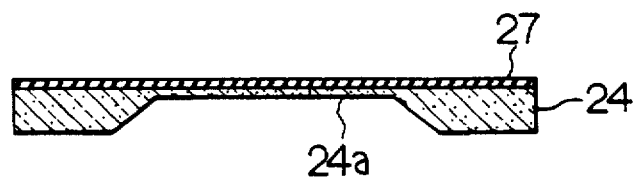
FIG. 4 is a sectional view of a pressure sensitive element of the pressure sensor according to the first embodiment of the present invention.

The sensing chip 23 comprises the pressure sensitive element 24, which is made by monocrystalline silicon, and a glass-made pedestal 25. As shown in FIG. 4, the pressure sensitive element 24 has a thin pressure sensing part (diaphragm) 24a which is formed by an electrochemical stop etching. The pressure sensing part 24a includes strain gauges (not shown) which form a bridge circuit to detect an applied pressure to the pressure sensing part 24a. The surface of the pressure sensitive element 24 is covered by a protective layer 27 which is made by, for example, silicon nitride to improve resistance to humidity.

The glass pedestal 25 of the sensing chip 23 has a coefficient of thermal expansion approximately the same as that of the pressure sensitive element 24. The pressure sensitive element 24 is adhered to the glass pedestal 25 by anodic bonding or the like. The glass pedestal 25 has a through hole 26 to lead measurement pressure to the back of the pressure sensitive element 24.

The sensing chip 23 is adhered to a stem 28 by a fluorocarbon adhesive 29. The stem 28 comprises a material whose coefficient of thermal expansion is approximately the same as that of the glass pedestal 25, such as a metal. In this embodiment, a 42-alloy which comprises 58% of iron and 42% of nickel is used as the stem 28.

The stem 28 is adhered to the bottom of the recess 30 by a fluorocarbon adhesive 31. As a result of the adhesion of the stem 28, the sensing chip 23 is hermetically fixed between the reference pressure chamber 12 and the measurement pressure chamber 13.

The stem 28 has a hole 32 for connecting the through hole 26 to the measurement pressure chamber 13. The pressure sensing part 24a is exposed to the atmospheric pressure which is led into the reference pressure chamber 12 and the pressure to be measured which is led into the measurement pressure chamber 13, and outputs a voltage, as a detected pressure signal, corresponding to the amount of the strain thereof according to the pressure difference between the atmospheric pressure and the pressure to be measured.

The detected pressure signal of the pressure sensitive element 24 is transmitted to the terminals 14a, 14b and 14c through bonding wires 33.

The lower half of the glass pedestal 25 and the stem 28 are embedded in a fluorocarbon adhesive 34 which is potted into the recess 30 to improve the airtightness and the strength of adhesion. Furthermore, a silicone gel 35 is filled on the fluorocarbon adhesive 34 to improve the resistance to humidity. The upper half of the glass pedestal 25 and the pressure sensitive element 24 are embedded in the silicone gel 35 but the silicone gel 35 on the surface of the pressure sensitive element 24 is controlled to be very thin.

The silicone gel 35 covers the bonding wire 33 and the surface of the terminals 14a through 14c exposed at the inside of the reference pressure chamber 12. The silicone gel 35 is also potted into the subchamber 16 and covers the surface of the terminals 14a through 14c exposed at the subchamber 16. Therefore, the silicone gel 35 is filled in the air capture recesses 42a through 42c and the air guidance holes 14a1 through 14c1.

In this embodiment, for example, the trade name "SIFEL" 210 which is made by Shinetsu Chemical Industry Co., Ltd. is used as the fluorocarbon adhesives 29, 31 and 34. An example of the chemical composition of the fluorocarbon adhesives 29, 31 and 34 is expressed as $-(CF(CF_3)-CF_2-O)_n-$.

The procedures of fixing the sensing chip 23 to the housing 11 are explained as follows.

Figure 5A:
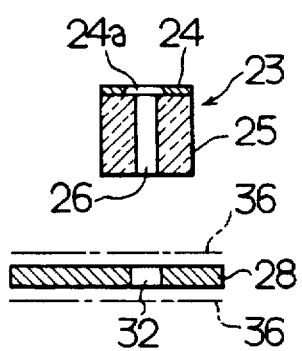
FIGS. 5A through 5F are flow diagrams showing steps of mounting a sensing chip on a housing of the first embodiment of the present invention.

In the first step shown in FIG. 5A, both sides of the stem 28 are coated with a primer 36.

Figure 5D:
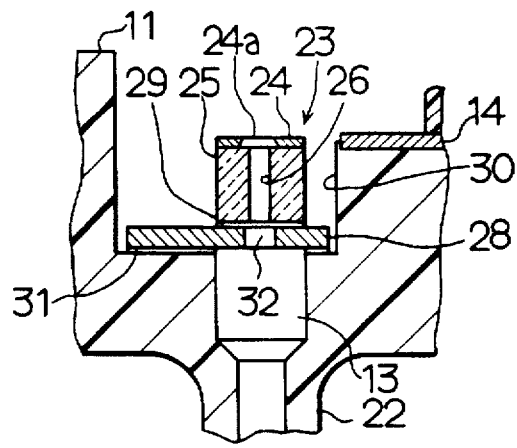
Figure 5B:
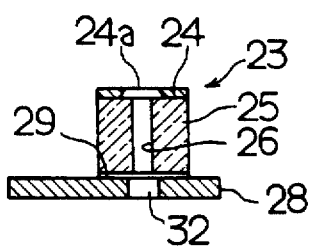

In the second step shown in FIG. 5B, the fluorocarbon adhesive 29 is coated around the hole 32 on the surface of the stem 28 and the glass pedestal 25 is fixed on the stem 28 by the fluorocarbon adhesive 29. Then, the fluorocarbon adhesive 29 is heated and hardened at the temperature of approximately 150° C. Thus, the sensing chip 23 is fixed to the stem 28 by the fluorocarbon adhesive 29.

In this embodiment, for example, heptane (petroleum class 1) is used as the primer 36 to improve the strength of adhesion between the stem 28 and the fluorocarbon adhesive 29. The primer 36 is applied only to the stem 28 and is not applied to the glass pedestal 25 to avoid variation in the properties of the pressure sensitive element 24 caused by the primer 36 passed through the through hole 26 and reached the pressure sensitive element 24.

Figure 5E:
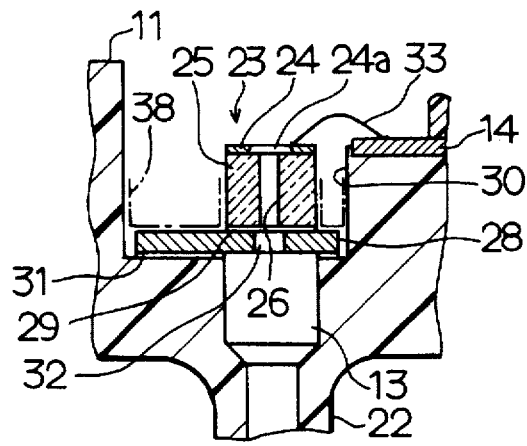
Figure 5C:
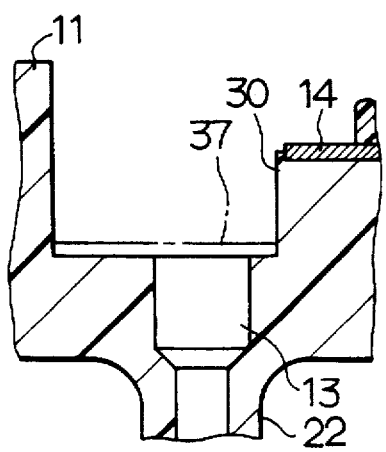

In the third step shown in FIG. 5C, a primer 37 is applied to the bottom surface of the recess 30.

In the fourth step shown in FIG. 5D, after coating the primer 37 with the fluorocarbon adhesive 31, the stem 28 adhered to the sensing chip 23 is fixed to the bottom surface of the recess 30 via the fluorocarbon adhesive 31. Then, the fluorocarbon adhesive 31 is heated and hardened. Thus, the sensing chip 23 is fixed to the housing 11 through the stem 28.

The strength of adhesion of the fluorocarbon adhesive 31 against the stem 28 and the bottom surface of the recess 30 is raised by the primers 36 and 37.

In the fifth step, after connecting the terminals 14a through 14c and the pressure sensitive element 24 by the bonding wires 33, a primer 38 is applied to the glass pedestal 25, the stem 28 and the inner surface of the recess 30 as shown in FIG. 5E.

Figure 5F:
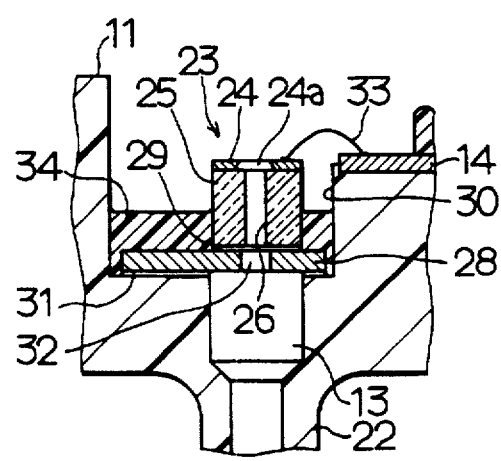

In the sixth step, after potting the fluorocarbon adhesive 34 in the recess 30 as shown in FIG. 5F, the fluorocarbon adhesive 34 is heated and hardened. According to this structure, the sensing chip 23 can be fixed to the housing 11 tightly and the airtightness between the reference pressure chamber 12 and the measurement pressure chamber 13 can be improved because the stem 28 and the glass pedestal 25 are embedded in the fluorocarbon adhesive 34.

The reason of fixing the stem 28 on the recess 30 by the fluorocarbon adhesive 31 before potting the fluorocarbon adhesive 34 is to prevent the fluorocarbon adhesive 34 from leaking in the measurement pressure chamber 13 when the fluorocarbon adhesive 34 is potted into the recess 30.

Figure 6:
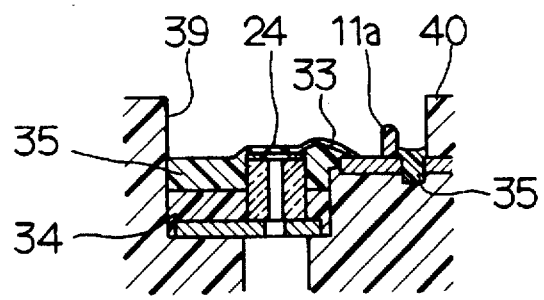
FIG. 6 is a partially sectional view of the first embodiment of the present invention.

In the seventh step shown in FIG. 6, the fluorocarbon adhesive 34, the pressure sensitive element 24 and the bonding wire 33 are covered by the potted silicone gel 35. The silicone gel 35 is also potted into the air capture recesses 42a through 42c, the air guidance holes 14a1 through 14c1 and a part of the subchamber 16.

Figure 8:
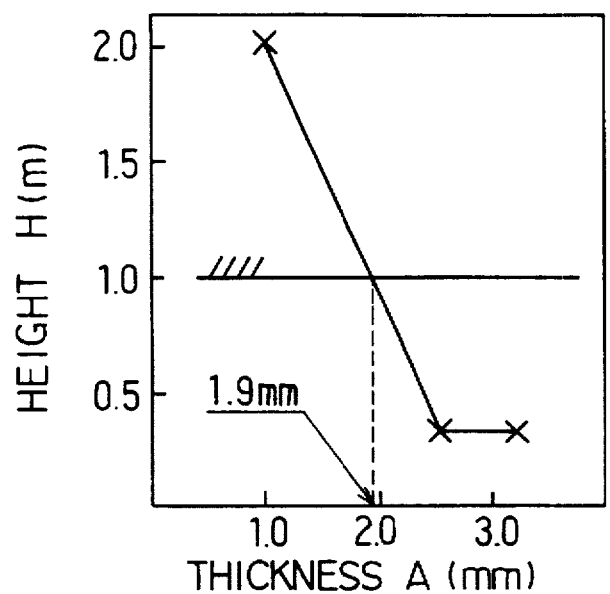
FIG. 8 is a graph showing the relationship between the thickness of a silicone gel on a surface of the pressure sensitive element and the dropping height causing a wire disconnection by a drop test.

The thickness of the silicone gel 35 on the pressure sensitive element 24 is approximately 1.5 mm. According to the test results shown in FIG. 8, it is preferable that the thickness of the silicone gel 35 on the pressure sensitive element 24 is less than 1.9 mm to prevent the bonding wire 33 from disconnection when the pressure sensor is dropped from the height greater than 1 m. FIG. 8 is a test result showing the relationship between the thickness A of the silicone gel 35 on a surface of the pressure sensitive element 24 and the dropping height H causing the disconnection of the bonding wire 33 according to the drop test.

After fixing the sensing chip 23 to the housing 11 as described above, the lid 17 is adhered to the housing 11 by the adhesive 18. The atmospheric pressure is led into the main chamber 12a and the subchamber 16 from the atmospheric pressure inlet passage 19 while the pressure to be measured is transmitted to the pressure sensing part 24a from the measurement pressure inlet port 22 through the measurement pressure inlet passages 22a and 22b, the hole 32 and the through hole 26.

Figure 7:
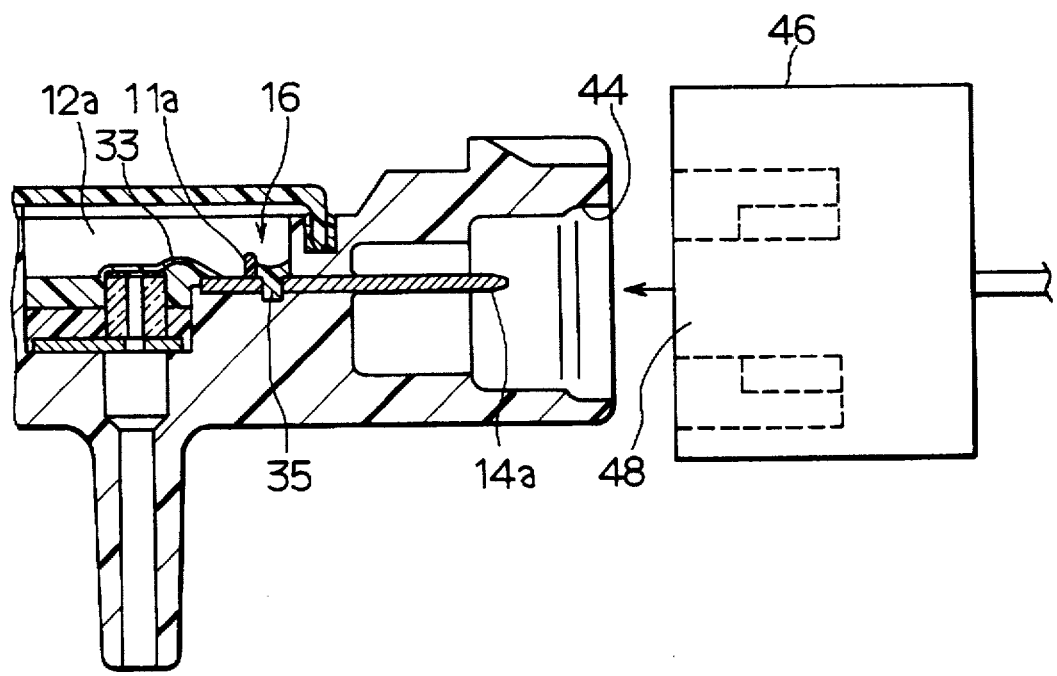
FIG. 7 is a partially sectional view of the first embodiment of the present invention.

According to the first embodiment of the present invention, an air in the connecting recess 44 is compressed by a seal rubber 48 of a connector 46 when the connector 46 is inserted to the connecting recess 44 as shown in FIG. 7. Since the high temperature is applied to the housing 11 and the terminals 14a through 14c when the terminals 14a through 14c are provided by the insert molding, a boundary adhesion between the housing 11 and the terminals 14a through 14c is deteriorated according to the difference of their coefficients of thermal expansion under the condition that the pressure sensor is cooled to the room temperature or the temperature changes.

Therefore, such compressed air may penetrate between the housing 11 and the terminals 14a through 14c. However, such compressed air is blocked by the silicone gel 35 in the air capture recesses 42a through 42c, the air guidance holes 14a1 through 14c1 and a part of the subchamber 16. Therefore, such compressed air can not reach the silicone gel 35 in the main chamber 12a, and turns into bubbles in the silicone gel 35 in the subchamber 16.

Since the bonding wire 33 which is covered by the silicone gel 35 in the main chamber 12a is prevented from being deformed by such bubbles, the reliability for the wire connection can be improved.

Furthermore, the amount of the silicone gel 35 is controlled such that the silicone gel 35 has a protruded shape corresponding to the astride configuration of the bonding wire 33 and the thickness of the silicone gel 35 on the pressure sensitive element 24 is less than 1.9 mm (in other words, the amount of the silicone gel 35 on the pressure sensitive element 24 and the bonding wire 33 is minimized). Accordingly, the movement of the silicone gel 35 is suppressed even if the pressure sensor receives an impact by dropping or the like the pressure sensor. Therefore, the bonding wire 33 is not deformed and the reliability for the wire connection against the impact on the pressure sensor can be improved.

Figure 9:
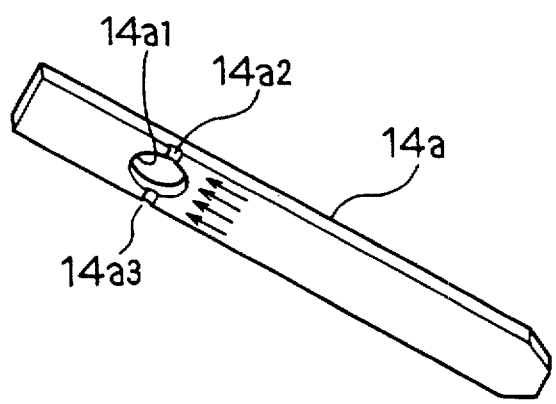
FIG. 9 is a perspective view of another terminal of the pressure sensor, according to the first embodiment of the present invention.

It is preferable to modify the terminals 14a through 14c as shown in FIG. 9 (FIG. 9 shows only 14a). In FIG. 9, the terminal 14a has air guidance slots 14a2 and 14a3 on the opposite side to the subchamber 16 (the side which faces the base 42). The slots 14a2 and 14a3 are aligned in a direction perpendicular to the direction of the arrows shown in FIG. 9. In FIGS. 3 and 9, the arrows represents the flow of the penetrating air. Likewise, the terminal 14b has air guidance slots 14b2 and 14b3 and the terminal 14c has air guidance slots 14c2 and 14c3 (not shown) in positions corresponding to the air guidance holes 14b1 and 14c1 opened to the subchamber 16. The size of the air guidance slots 14a2 and 14a3 is determined such that the resin may not be filled therein when the insert molding is carried out.

In FIG. 9, bottom surfaces of the air guidance slots 14a2 and 14a3 are parallel to the flat surface of the terminal 14a. However, the configuration of each air guidance slot is not limited thereto. It is preferable that the air guidance slots 14a2 and 14a3 be formed such that a depth thereof becomes gradually larger toward the air guidance hole 14a1.

According to the air guidance slots 14a2 and 14a3, the compressed air penetrating between the terminal 14a and the base 42 is smoothly guided into the air guidance hole 14a1.

The position of the air guidance slots 14a2 and 14a3 is not be limited at the perpendicular position to the direction of the arrows.

According to the first embodiment, the glass pedestal 25 is fixed to the stem 28 by the fluorocarbon adhesive 29 and the stem 28 is fixed to the housing 11 by the fluorocarbon adhesive 31. Since the thermosetting temperature of the fluorocarbon adhesive is approximately 150° C., the sensing chip 23 can avoid to be heated at high temperature like soldering or brazing. Therefore, the heat distortion does not remain after fixing the sensing chip 23 and the characteristic fluctuation can be prevented.

Figure 10:
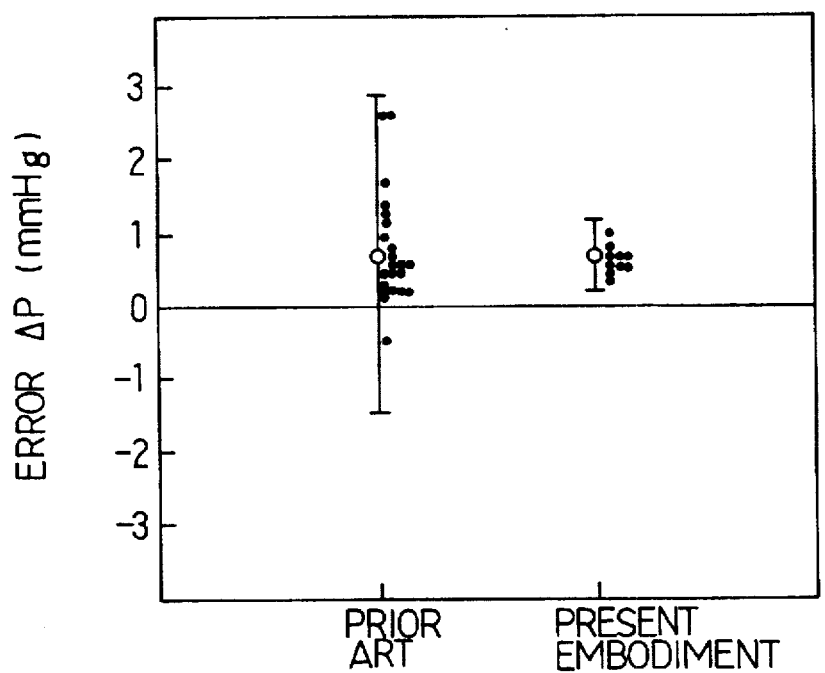
FIG. 10 is a diagram showing detection errors between a prior art and the first embodiment of the present invention.

FIG. 10 shows test results comparing detection errors ΔP between a prior art whose sensing chip is fixed to a housing through a stem by solder and the first embodiment of the present invention. The detection errors for the prior art are greater than those for the first embodiment and the range of the fluctuation of the detection errors for various prior arts is broader than that for the first embodiment. Therefore, the prevention of the characteristic fluctuation can be achieved by the first embodiment.

The adhesives 29, 31 and 34 should have the ability to seal between the reference pressure chamber 12 and the measurement pressure chamber 13 for a long time as well as the ability to adhere the sensing chip 23, the stem 28 and the housing 11 each other. These abilities are lowered according to the deterioration of the adhesives 29, 31 and 34.

The deterioration of the adhesives 29, 31 and 34 has a close relationship with a chemicalproof, i.e., a swelling characteristic. Especially, since the pressure sensor described in the first embodiment may be used under the condition that the measurement pressure chamber 13 is exposed at gasoline, the adhesives 29, 31 and 34 should not have the swelling characteristic when it is exposed at gasoline.

When the pressure sensor is used in the high temperature atmosphere (up to 80° C. is supposed), the housing 11 produces a heat distortion, and such distortion may be transferred to the sensing chip 23. Since the adhesives 29, 31 and 34 are placed between adjacent ones of the housing 11, sensing chip 23 and the stem 28, those adhesives can cancel such distortion of the housing 11 and prevent the sensing chip 23 from such distortion if the adhesives have a high elasticity.

Therefore, it is preferable that the adhesives 29, 31 and 34 have strong adhesion to fix the sensing chip 23 rigidly, low degree of swelling characteristic to cause no deterioration for a long period, and high elasticity for canceling the distortion of the housing 11.

According to various experiments made by the inventors to find favorable degree of the adhesion strength, degree of swelling and elasticity of the adhesive. As a result, inventors found that over 0.13 MPa of the tensile strength which directly has a relationship with the adhesion strength, under 20% of the degree of swelling which has a relationship with the deterioration and under 5 MPa of Young's modulus which has a relationship with the elasticity are desirable.

Taking such experimental results into consideration, the fluorocarbon adhesives 29, 31 and 34 which have the low degree of swelling property (high chemical resistance) and small Young's modulus (high elasticity) are used in the embodiment of the present invention.

Characteristics of the fluorocarbon adhesive, epoxy resin adhesive, silicone resin adhesive and fluorosilicon adhesive and their evaluation results are shown in the following table:

In this table, ○, Δ and × represent "very good", "good" and "not good" respectively.

| ITEM | TARGET | EPOXY | | SILICONE | | FLUOROSILICON | | FLUOROCARBON | |
|---|---|---|---|---|---|---|---|---|---|
| TENSILE STRENGTH | Over 0.13 MPa | 2–10 MPa | ○ | 0.5–2 MPa | ○ | 0.5–2 MPa | ○ | 0.5–2 MPa | ○ |
| YOUNG'S MODULUS | Under 5 MPa | 30–100 MPa | X | 0.5–2 MPa | ○ | 0.5–2 MPa | ○ | 0.5–3 MPa | ○ |
| DEGREE OF SWELLING | under 20% | 10–30% | Δ | 50–100% | X | 20–40% | X | 5–15% | ○ |
| TOTAL EVALUATION | | | X | | X | | X | | ○ |

It is obvious from this table that the fluorocarbon adhesive is the most favorable adhesive among the above four adhesives.

According to the embodiment of the present invention, the sensing chip 23 is rigidly fixed to the housing 11 by the adhesives 29, 31 and 34 with an excellent seal between the reference pressure chamber 12 and the measurement pressure chamber 13 against the difference of the pressure between them. Furthermore, the sensing chip 23 is prevented from distortion of the housing 11 caused by the temperature change and the adhesives 29, 31 and 34 can keep strong adhesion and elasticity for a long period without deterioration.

The adhesive shall not be limited only to the fluorocarbon adhesive used in the embodiment but also other adhesives which satisfy the targets of the tensile strength, Young's modulus and the degree of swelling shown in the above table.

Figure 11:
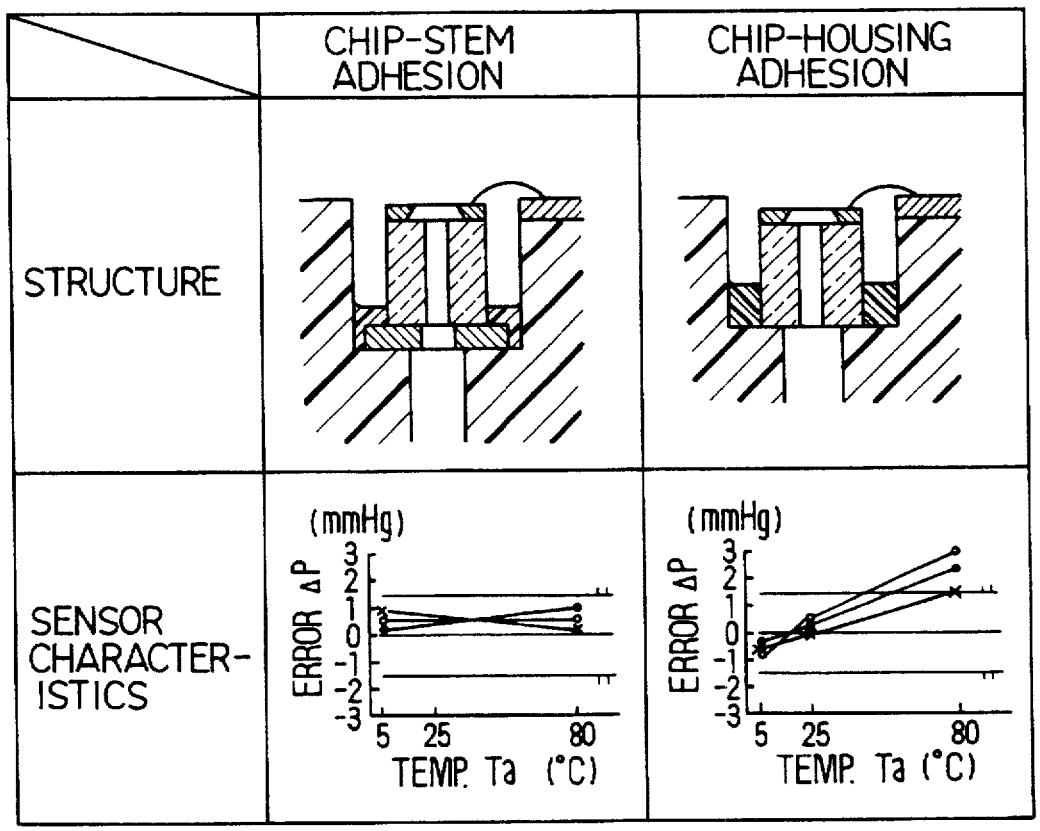
FIG. 11 is a diagram showing structures and sensor characteristics of a chip-stem adhesion and a chip-housing adhesion.

In the embodiment, the distortion of the housing 11 is canceled well because the stem 28 is fixed between the sensing chip 23 and the housing 11. FIG. 11 shows detected pressure errors ΔP under the conditions of various atmospheric temperature Ta of the housing 11 for the pressure sensor shown in the embodiment (chip-stem adhesion) and a pressure sensor whose sensing chip 23 is fixed directly to the housing 11 by the adhesive (chip-housing adhesion). The pressure to be detected is constantly set to −7.5 mmHg.

Although the tolerance of the detected pressure errors ΔP should be within the range between −1.5 mmHg and +1.5 mmHg, the detected pressure errors ΔP of the chip-housing adhesion under the temperature of 80° C. become over +3 mmHg. However, the maximum detected pressure error ΔP of the chip-stem adhesion is approximately +1 mmHg. Therefore, it is proved that the chip-stem adhesion can prevent the sensing chip 23 (especially the pressure sensitive element 24) from the heat distortion of the housing 11 and the detected pressure error can be minimized.

The chip-stem adhesion method using adhesive should not be limited only to the relative pressure sensor but also applied to an absolute pressure sensor, an acceleration sensor and other sensors whose sensing chips are fixed in their housings. The housing 11 shall not be limited to the resin. The application of the primer 36 to the back of the stem 28 can be after fixing the glass pedestal 25 of the sensing chip 23 to the stem 28. The stem 28 shall not be limited only to metal but also to resin. The fluorocarbon adhesive 34 which ensures the adhesion strength of the sensing chip 23 and the seal between the reference pressure chamber 12 and the measurement pressure chamber 13 may be required according to the pressure difference and the like between the reference pressure chamber 12 and the measurement pressure chamber 13.

According to the embodiment of the present invention, the characteristic fluctuation of the pressure sensitive element caused by the distortion of the sensing chip can be reduced because the sensing chip is fixed to the housing by the fluorocarbon adhesive.

According to the embodiment of the present invention, the pressure sensitive element can be prevented from the primer because the primer is not applied to the sensing chip.

Figure 12:
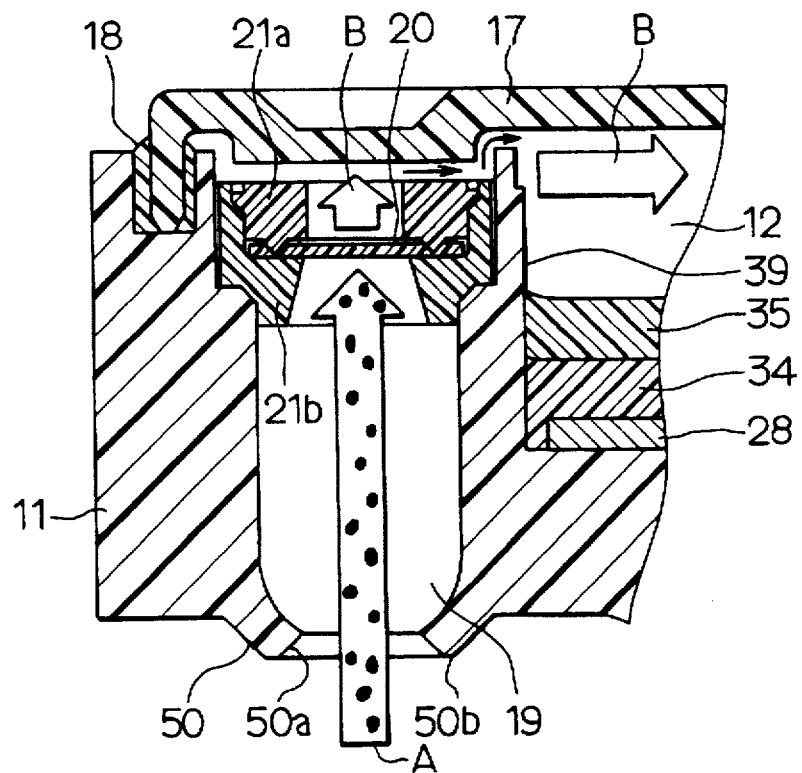
FIG. 12 is a partially sectional view of the first embodiment of the present invention.
Figure 13:
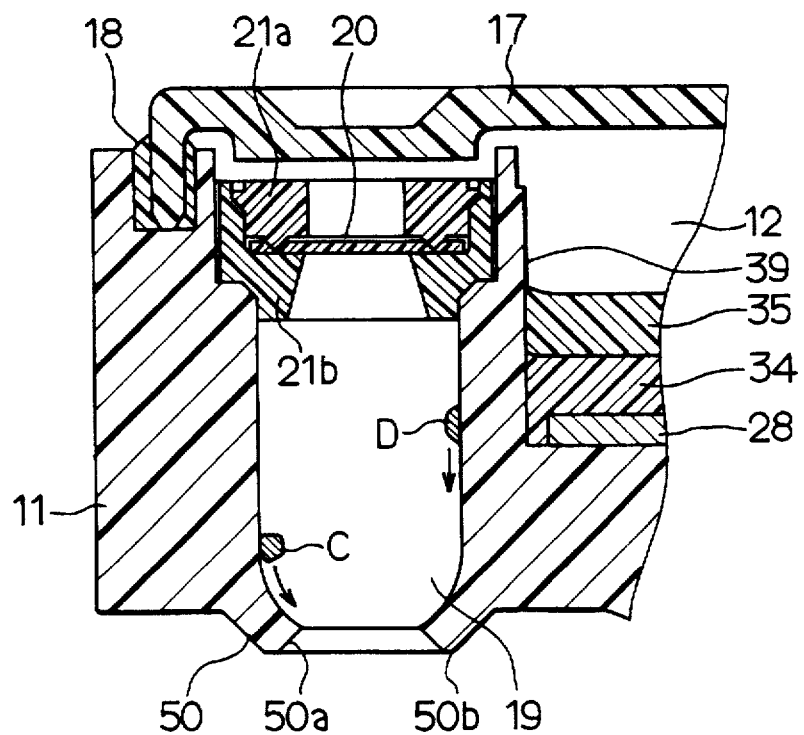
FIG. 13 is a partially sectional view of the first embodiment of the present invention.

In FIGS. 12 and 13, the atmospheric pressure inlet passage 19 which has a cylindrical shape is provided such that an upper portion thereof has a larger radius. A water repellent filter 20 is held and hermetically sealed at the upper portion of the atmospheric pressure inlet passage 19 in such a manner that the water repellent filter 20 is sandwiched between resinous holders 21a and 21b which have approximate ring shape and an outside surface of the holder 21b is welded to an inner surface of the atmospheric pressure inlet passage 19.

The water repellent filter 20 is a well known porous filter which has an outside diameter (e.g., φ2.4 mm) and a porous diameter (e.g., φ1.0 μm) to be able to ensure a certain amount of ventilation (e.g., more than 0.37 cc/sec) and which is done by water repellent finish to prevent a liquid adhesion. The water repellent filter 20 is placed at the depths of the atmospheric pressure inlet passage 19 apart from a protrudent inlet 50 to ventilate and to prevent from liquid or dust.

The atmospheric pressure inlet passage 19 has an opening at a lower surface of the housing 11 and the protrudent inlet 50 which protrudes a little downward is integrally formed with such opening.

As shown in FIGS. 12 and 13, the inner surface of the atmospheric pressure inlet passage 19 and the outer surface of the protrudent inlet 50 have a tapered shape in such a manner that the diameter thereof gradually becomes smaller downward and the protrudent inlet 50 have a certain thickness. An inner surface 50a of the protrudent inlet 50 has a tapered shape in such a manner that the diameter thereof gradually becomes greater toward a protrudent edge 50b.

In the first embodiment, a lower part (near a fuel tank) of a vehicle (automobile) is equipped with the pressure sensor in such a manner that the opening of the atmospheric pressure inlet passage 19 faces the ground. The reference pressure chamber 12 is communicated with the atmosphere through the atmospheric pressure inlet passage 19 and the water repellent filter 20, while the measurement pressure chamber 13 is communicated with a pipe which connects the fuel tank with a canister through the measurement pressure inlet port 22. The pressure in the pipe is led to the measurement pressure chamber 13 to be measured.

If the protruded inlet 50 is omitted from the first embodiment, since the atmospheric pressure inlet passage 19 has the opening to the atmosphere, it may be possible that liquid, dirt, dust and the like may enter the reference pressure chamber 12. Such ingress may cause a deterioration of parts, such as corrosion or disconnection. Furthermore, since the diameter of such opening is small, a water film may shut the opening when splashing or dew condensation occurs. Therefore, such water film may cause characteristics fluctuations and a decline of detection accuracy of the pressure sensor because the pressure in the reference pressure chamber 12 becomes different from the atmospheric pressure.

Figure 14:
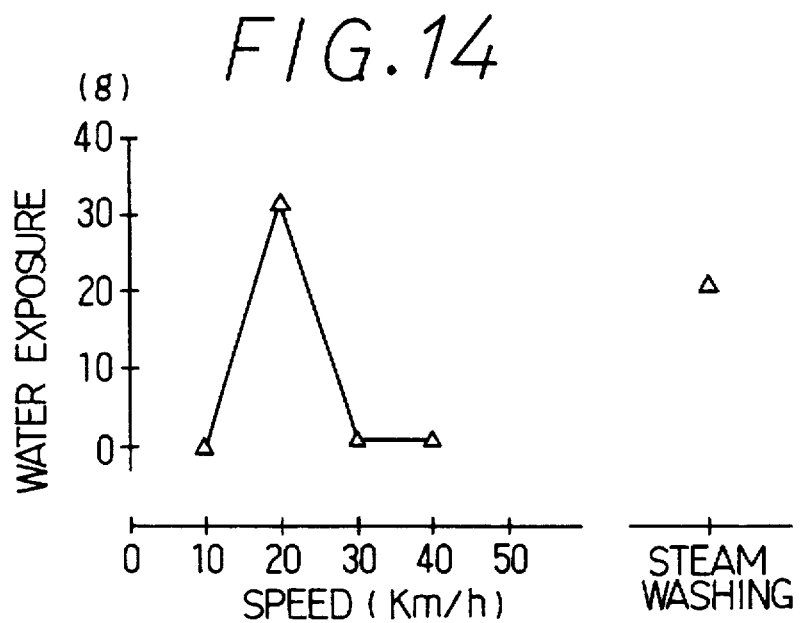
FIG. 14 is a graph showing the relationship between amounts of water to which a sensor is exposed and a speed of a car according to test results.

Especially, the pressure sensor in the first embodiment is used outside the automobile and may easily receive muddy water, dirt and dust. FIG. 14 shows the relationship between amounts of water to which the pressure sensor is exposed and a speed of an automobile under the condition that the automobile ran a watercourse whose depth is 5 cm and the other relationship between an amount of water to which the pressure sensor is exposed and a steam washing according to the inventors' test results. The both test results show that the pressure sensor is exposed to considerable amount of water.

However, according to the first embodiment of the present invention, the protruded inlet 50 prevents liquid, dirt, dust and the like from invading the atmospheric pressure inlet passage 19 from an oblique direction. Furthermore, since the inner surface of the atmospheric pressure inlet passage 19 and the outer surface of the protrudent inlet 50 have a tapered shape in such a manner that the diameter thereof gradually becomes smaller downward, the diameter of the protrudent inlet 50 can be reduced and it becomes more difficult for the contaminants to enter the atmospheric pressure inlet passage 19.

Since the inner surface 50a has a tapered shape in such a manner that the diameter thereof gradually becomes greater toward a protrudent edge 50b in the first embodiment, good drainage can be achieved because contacting area with water is less comparing to a pressure sensor without such tapered shape of the inner surface 50a. Therefore, even if a water drop or the like enters the atmospheric pressure inlet passage 19, the tapered shape of the inner surface 50a can prevent such water drop from becoming a water film and the water drop or the like is discharged.

Since the water repellent filter 20 is provided in the atmospheric pressure inlet passage 19 in the first embodiment, even if the air A including liquid, dirt and dust enters the atmospheric pressure inlet passage 19 as shown in FIG. 12, such liquid, dirt and dust is blocked by the water repellent filter 20 and only the clean air B is led into the reference pressure chamber 12. The water repellent filter 20 is provided in the depths of (at the upper portion of) the atmospheric pressure inlet passage 19, most of the contaminant are prevented from reaching the water repellent filter 20.

Since the water repellent filter 20 blocks the contaminant at its lower surface (the surface facing to the ground) in the first embodiment, the blocked contaminant drops by gravity. Therefore, such structure can prevent the water repellent filter 20 from choking with the blocked contaminant.

The inventors found that the probability of water exposure of the water repellent filter 20 can be reduced drastically when the water repellent filter 20 is placed over 8 mm upper from the inner surface 50a.

Since the opening of the atmospheric pressure inlet passage 19 is provided downwardly in the first embodiment, if the dirt and dust C and liquid D which entered the atmospheric pressure inlet passage 19 adhere on the inner surface of the atmospheric pressure inlet passage 19 as shown in FIG. 13, such contaminant can be discharged from the protrudent inlet 50 by gravity.

(SECOND EMBODIMENT)

Figure 15:
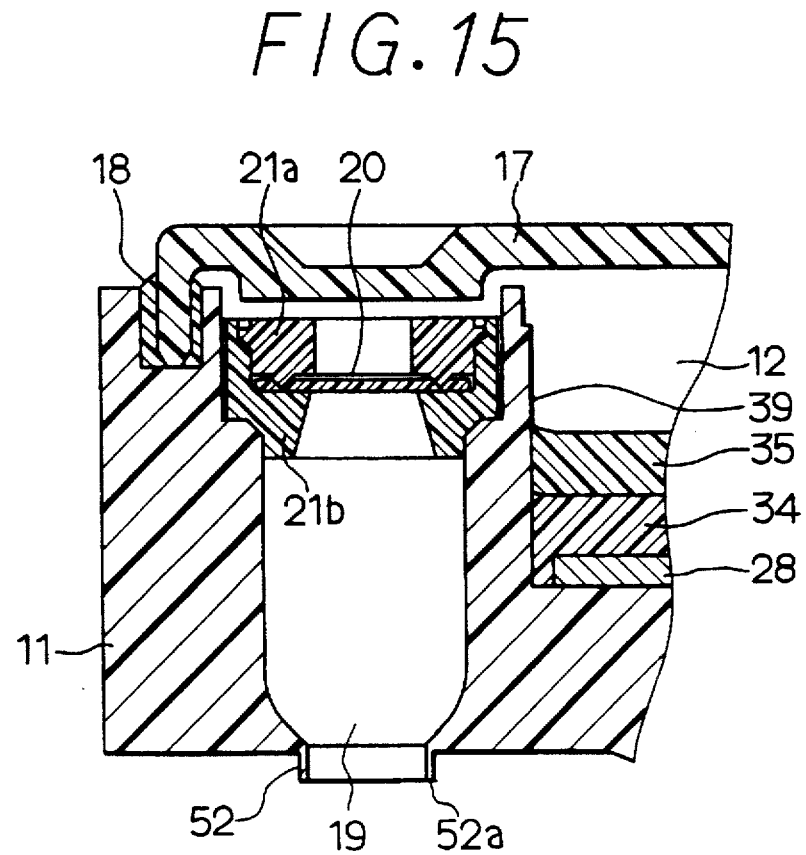
FIG. 15 is a partially sectional view of a second embodiment of the present invention.

A second embodiment of the present invention is described with reference to FIG. 15.

In the second embodiment, the structure of a protrudent inlet 52 is different from the first embodiment. The protrudent inlet 52 has a thin and cylindrical shape and a protruded edge 52a which is thin but its inner surface has no tapered shape. However, the inner surface of the atmospheric pressure inlet passage 19 has a tapered shape in such a manner that the diameter thereof gradually becomes smaller downwardly. Therefore, similar advantages to the first embodiment can be achieved by the second embodiment.

(THIRD EMBODIMENT)

Figure 16:
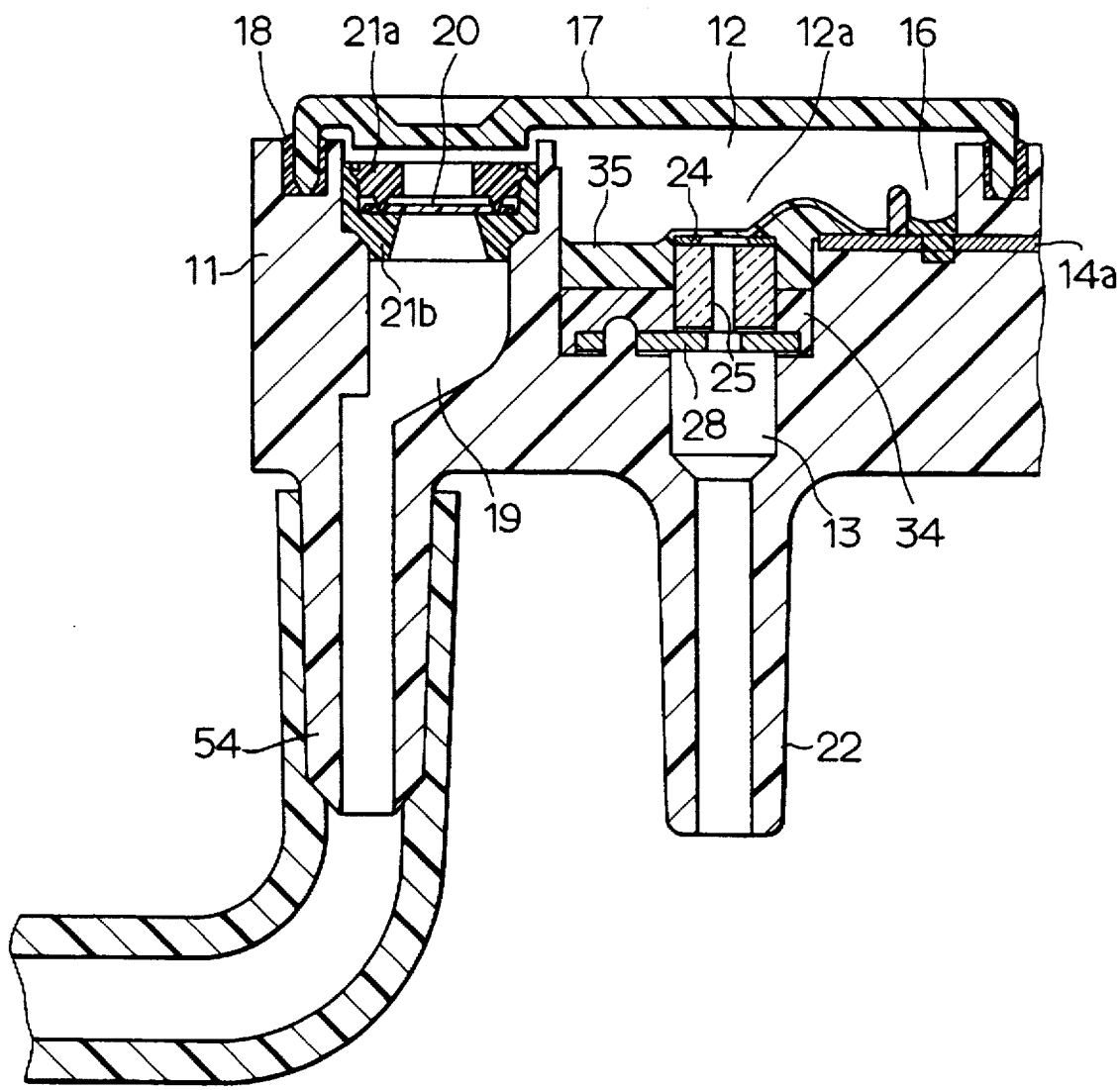
FIG. 16 is a partially sectional view of a third embodiment of the present invention.

A third embodiment of the present invention is described with reference to FIG. 16.

In the third embodiment, a protrudent inlet 54 has a shape of a long pipe and enables to connect with a rubber hose 56. According to the third embodiment, the tip of the hose 56 which is not connected to the protrudent inlet 54 can be located at the most clean place.

The pressure sensor described in the first through third embodiments can be adopted for usages other than automobiles.

Although the present invention has been fully described in connection with the preferred embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. A pressure sensor comprising:

a resin housing forming a reference pressure chamber and a measurement pressure chamber, said housing having a barrier wall disposed to define, in said reference pressure chamber, a main chamber and a subchamber on opposite sides of said barrier wall, said measurement pressure chamber being opposite to said main chamber, said reference pressure chamber having an inlet for introducing an atmospheric air thereinto;

a pressure sensitive element fixed to said resin housing to define said main chamber and said measurement pressure chamber, said pressure sensitive element having a distortion detection portion;

a terminal integrally formed by an insert molding for penetrating said barrier wall and said resin housing, a first end portion thereof being located at said main chamber, a second end portion thereof being exposed to an outside of said resin housing, a part of said terminal between said first and second end portions being located at said subchamber;

a wire for electrically connecting said distortion detection portion to said first end portion of said terminal; and a gel potted into said main chamber in such a manner that said gel covers said pressure sensitive element, said wire and said first end portion of said terminal.

2. A pressure sensor according to claim 1, wherein said pressure sensitive element is fixed to said resin housing in such a manner that said pressure sensitive element and said resin housing sandwich a glass, said glass has a thermal expansion coefficient approximate to that of said pressure sensitive element.

3. A pressure sensor according to claim 1, wherein;

said gel includes a silicone gel, an amount of said silicone gel is minimized such that said silicone gel on said wire has a protruded shape.

4. A pressure sensor according to claim 1, wherein;

said reference pressure chamber includes a water repellent filter at said inlet.

5. A pressure sensor according to claim 1, wherein said terminal has a through hole at said part of said terminal being located at said subchamber.

6. A pressure sensor according to claim 5, wherein;

said terminal has an air guidance slot at a periphery of said through hole on an opposite surface thereof to said subchamber in such a manner that said air guidance slot and said through hole form a passage together.

7. A pressure sensor according to claim 1, wherein said gel is potted into said subchamber.

8. A pressure sensor comprising:

a resin housing forming a reference pressure chamber where an atmospheric pressure is introduced and a measurement pressure chamber where a pressure to be measured is introduced;

a pressure sensitive element fixed to said housing in such a manner that a pressure difference between said chambers is applied thereto;

a terminal provided penetrating said housing and extending into said reference pressure chamber;

a wire connecting said element with said terminal to output an electric signal corresponding to said applied pressure difference;

a barrier member contacting said terminal and disposed in said reference pressure chamber to define, in said reference pressure chamber, a main chamber and a subchamber along with said terminal extending in said reference pressure chamber, said sensitive element and said wire being disposed in said main chamber of said reference pressure chamber; and a gel potted at least in said main chamber to cover said wire and sensitive element.

9. A pressure sensor according to claim 8, wherein said barrier member is integratedly formed with said resin housing.

10. A pressure sensor according to claim 1, further comprising:

a glass pedestal, wherein said pressure sensitive element is fixed to said glass pedestal which is adhered to an inside of said resin housing by a fluorocarbon adhesive.

11. A pressure sensor according to claim 8, further comprising:

a glass pedestal, wherein said pressure sensitive element is fixed to said glass pedestal which is adhered to an inside of said resin housing by a fluorocarbon adhesive.

12. A pressure sensor comprising:

a resin housing forming a first chamber and a second chamber;

a pressure sensitive element fixed to said housing in such a manner that a pressure difference between said chambers is applied thereto;

a terminal provided penetrating said housing and extending into said first chamber;

a wire connecting said element with said terminal to output an electric signal corresponding to said applied pressure difference;

a barrier member contacting said terminal and disposed in said first chamber to define, in said first chamber, a main chamber and a subchamber along with said terminal, said sensitive element and said wire being disposed in said main chamber; and a gel potted at least in said main chamber to cover said wire and sensitive element.

* * * * *